United States Patent
Ferrante et al.

(10) Patent No.: US 12,314,552 B2
(45) Date of Patent: May 27, 2025

(54) CALIBRATOR HAVING AN ENHANCED USER INTERFACE

(71) Applicant: Fluke Corporation, Everett, WA (US)

(72) Inventors: Joseph V. Ferrante, Redmond, WA (US); Jennifer C. Bronson, Snohomish, WA (US); David B. Bartley, Seattle, WA (US); William D. Gaviria, Mill Creek, WA (US); William J. Britz, Tulalip, WA (US); Chester W. Hoster, Lake Stevens, WA (US); Alexander J. Dorchak, Jr., Arlington, WA (US); Kevin L Johnson, Marysville, WA (US); Steven J. Zopfi, Lake Stevens, WA (US)

(73) Assignee: Fluke Corporation, Everett, WA (US)

( * ) Notice: Subject to any disclaimer, the term of this patent is extended or adjusted under 35 U.S.C. 154(b) by 593 days.

(21) Appl. No.: 17/698,977

(22) Filed: Mar. 18, 2022

(65) Prior Publication Data
US 2023/0297223 A1    Sep. 21, 2023

(51) Int. Cl.
G06F 3/0482    (2013.01)
G01R 35/00    (2006.01)
G06F 3/04847    (2022.01)

(52) U.S. Cl.
CPC ....... *G06F 3/04847* (2013.01); *G01R 35/005* (2013.01)

(58) Field of Classification Search
CPC .......................... G06F 3/04847; G01R 35/005
See application file for complete search history.

(56) References Cited

U.S. PATENT DOCUMENTS

| | | | |
|---|---|---|---|
| 5,920,297 A | | 7/1999 | Alexander |
| 6,054,984 A | * | 4/2000 | Alexander ............ G06F 3/0481 345/440 |

(Continued)

FOREIGN PATENT DOCUMENTS

| | | |
|---|---|---|
| CN | 111323627 A | 6/2020 |
| JP | 2014-25806 A | 2/2014 |

OTHER PUBLICATIONS

Fluke Calibration, "Operators Manual," 5522A Multi-Product Calibrator, Jan. 2011, 426 pages.

(Continued)

*Primary Examiner* — Mohamed Charioui
*Assistant Examiner* — Christine Y Liao
(74) *Attorney, Agent, or Firm* — Seed IP Law Group LLP (57) ABSTRACT

A calibrator having an enhanced user interface (UI) is provided. The calibrator outputs, over an output terminal of the calibrator, an electrical signal. The calibrator presents, on a display of the calibrator, a graphical indication associated with an electrical quantity of the electrical signal. The calibrator or a controller thereof synchronizes a color of the graphical indication with a color emitted by a light indicator associated with the output terminal. The calibrator presents, together with the graphical indication, a signal property GUI element that is selectable and representative of a signal property associated with the electrical signal. In response to user selection of the signal property GUI element, the calibrator displays an editable GUI element permitting user modification of the signal property and the calibrator modifies the electrical signal according to user input.

20 Claims, 9 Drawing Sheets

(56) References Cited

U.S. PATENT DOCUMENTS

| | | |
|---|---|---|
| 2005/0035966 A1 | 2/2005 | Pasquarette et al. |
| 2012/0112985 A1 | 5/2012 | Franz et al. |
| 2015/0172814 A1* | 6/2015 | Usher .................... H04R 3/005 381/92 |
| 2022/0308089 A1 | 9/2022 | Wu et al. |

OTHER PUBLICATIONS

European Search Opinion and European Search Report for EP Application No. 22 216 040.0 dated Aug. 11, 2023, 5 pages.

* cited by examiner

CALIBRATOR HAVING AN ENHANCED USER INTERFACE

BACKGROUND

Technical Field

This application is directed to an electrical testing device, and, in particular, to a calibrator, having an enhanced user interface (UI).

Description of the Related Art

Testing instruments, including electrical calibrators, often include multiple terminals. A testing instrument receives and outputs signals of various types over the terminals. Due to the availability of multiple terminals to which a user may couple connectors, the likelihood remains present that a user misidentifies a terminal over which to draw or input a signal. Furthermore, as the functionality of testing instruments expands, so do corresponding menu structures for configuring the functionality of the testing instruments, leading to greater complexity of operation of the testing instruments.

BRIEF SUMMARY

Provided is a calibrator equipped with output terminals, having respective terminal light indicators, over which the calibrator outputs an electrical quantity. The calibrator displays an indication of the electrical quantity on a display and synchronizes the color emitted by the light indicator with the color of the indication.

The calibrator displays the indication of the electrical quantity together with a signal property graphical user interface (GUI) element that enables the user to directly modify a signal property of the electrical quantity. In response to receiving the modified signal property, the calibrator adjusts the electrical quantity.

The calibrator may display identifications that uniquely identify editable GUI elements on any display screen presented to the user. The identifications may point the user to GUI elements that are editable by the user, for example, through a touchscreen feature of the display. The calibrator may display the identifications of the editable GUI elements in response to user selection of an area of the display that does not include an editable GUI element. The user may, accordingly, modify values, quantities, or features represented by the GUI elements by interacting with the displayed GUI elements.

The calibrator may display a connectivity diagram to aid the user in connecting the calibrator to another device. The connectivity diagram includes diagrammatical representations of the calibrator, the device, and a connector coupling the calibrator to the device and the representation of the calibrator also includes representations of colors of light associated with terminals of the calibrator that are to be used in connecting the calibrator to the device.

DETAILED DESCRIPTION

Due to the fact that calibrators have multiple terminals, users are susceptible to couple probes or devices to a different terminal than the terminal over which a signal is output. Provided is a calibrator equipped with output terminals having respective light indicators, for example, proximate to the output terminals. The calibrator outputs an electrical quantity over an output terminal. The calibrator displays an indication of the electrical quantity on a display together with an indication of color emitted by the light indicator associated with the output terminal. The calibrator synchronizes the color emitted by the light indicator with the color of the indication.

A user operating the calibrator uses the color of the indication and the color emitted by the light indicator to identify the terminal over which the electrical quantity is output, for example, for connecting a proper terminal to a connector. Accordingly, the likelihood that the user identifies the proper terminal is increased. Further, the likelihood that the user taps an incorrect, different terminal than the terminal over which the electrical quantity is output is reduced.

The wide-ranging functionality of calibrators results in calibrators having multiple parameters that are configurable by a user. Provided herein is a calibrator that displays an indication of the electrical quantity together with a signal property graphical user interface (GUI) element. The signal property GUI element enables the user to directly modify a signal property of the electrical quantity. The user may select the GUI element. In response to user selection of the GUI element, the calibrator displays an editable GUI element enabling the user to enter the desired signal property of the electrical quantity (for example, by typing in or otherwise modifying the signal property). In response to receiving the modified signal property, the calibrator adjusts the electrical quantity. The calibrator sets the signal property of the electrical quantity in accordance with the received user modification.

Providing access to an editable field directly from the display of the electrical calibrator enables the user to expeditiously adjust electrical quantity properties while forgoing the need to navigate complex menu structures.

The calibrator described herein displays an indication of an electrical quantity output over a terminal together with multiple properties of the electrical quantity that are directly settable by user interaction. A technique is provided to improve user experience and signify to the user the identity of displayed information that is directly settable or editable by the user. The calibrator may display identifications that uniquely identify editable GUI elements on any display screen presented to the user. The identifications may point the user to GUI elements that are editable by the user, for example, through a touchscreen feature of the display. The identifications may be outlines representing boundaries of the editable GUI elements, whereby user selection of a display area within an outline (for example, by applying a touch to the touchscreen display) enables the user to modify a value, quantity, or feature represented by a GUI element. The calibrator may display the identifications of the editable GUI elements in response to user selection of an area of the display that does not include an editable GUI element. For example, if the user selects an area of the display on which information is not displayed, the calibrator may respond by displaying the identifications to point the user to GUI elements (and areas of the display covering the elements) that are in fact responsive to user input and directly editable from the display. The user may, accordingly, modify values, quantities, or features represented by the GUI elements by interacting with the displayed GUI elements. The identifications enhance the ease of use of the calibrator whereby a user receives information pointing out which displayed GUI elements are modifiable by the user and increase the likelihood that the user more fully utilizes the calibrator functionality.

The calibrator may itself be calibrated during, and during calibration, the calibrator is coupled to another device and/or connector cables. The calibrator may display a connectivity diagram to aid the user in connecting the calibrator to the other device. The calibrator may display the connectivity diagram in response to user selection, from the display of the calibrator, of a GUI element. The connectivity diagram includes diagrammatical representations of the calibrator, the other device, and a connector coupling the calibrator to the other device to aid and inform the user in performing the calibration.

The representation of the calibrator also includes representations of colors of light associated with terminals of the calibrator that are to be used in connecting the calibrator to the other device.

The connectivity diagram advantageously eases use of the calibrator by informing the user of identities of terminals to couple to electrical leads of the connector using both relative positions of the terminals on the calibrator (or a front panel thereof) and colors of light emitted by light indicators associated with the respective terminals.

As will be described and illustrated by examples shown herein, the present disclosure provides guiding use of terminals of a calibrator, modifying properties of output electrical signals and a calibrator having an enhanced user interface (UI) that simplifies user operation of the calibrator by allowing direct modification of functionality of the calibrator without requiring the user to navigate multiple, complicated menu structures, while also visually indicating the proper terminals of the calibrator to use in the current calibrator configuration. For example, a configured calibrator outputs, over an output terminal of the calibrator, an electrical signal. The calibrator presents, on a display of the calibrator, a graphical indication associated with an electrical quantity of the electrical signal. The calibrator or a controller thereof synchronizes a color of the graphical indication with a color emitted by a light indicator on the calibrator associated with the output terminal.

Figure 1:
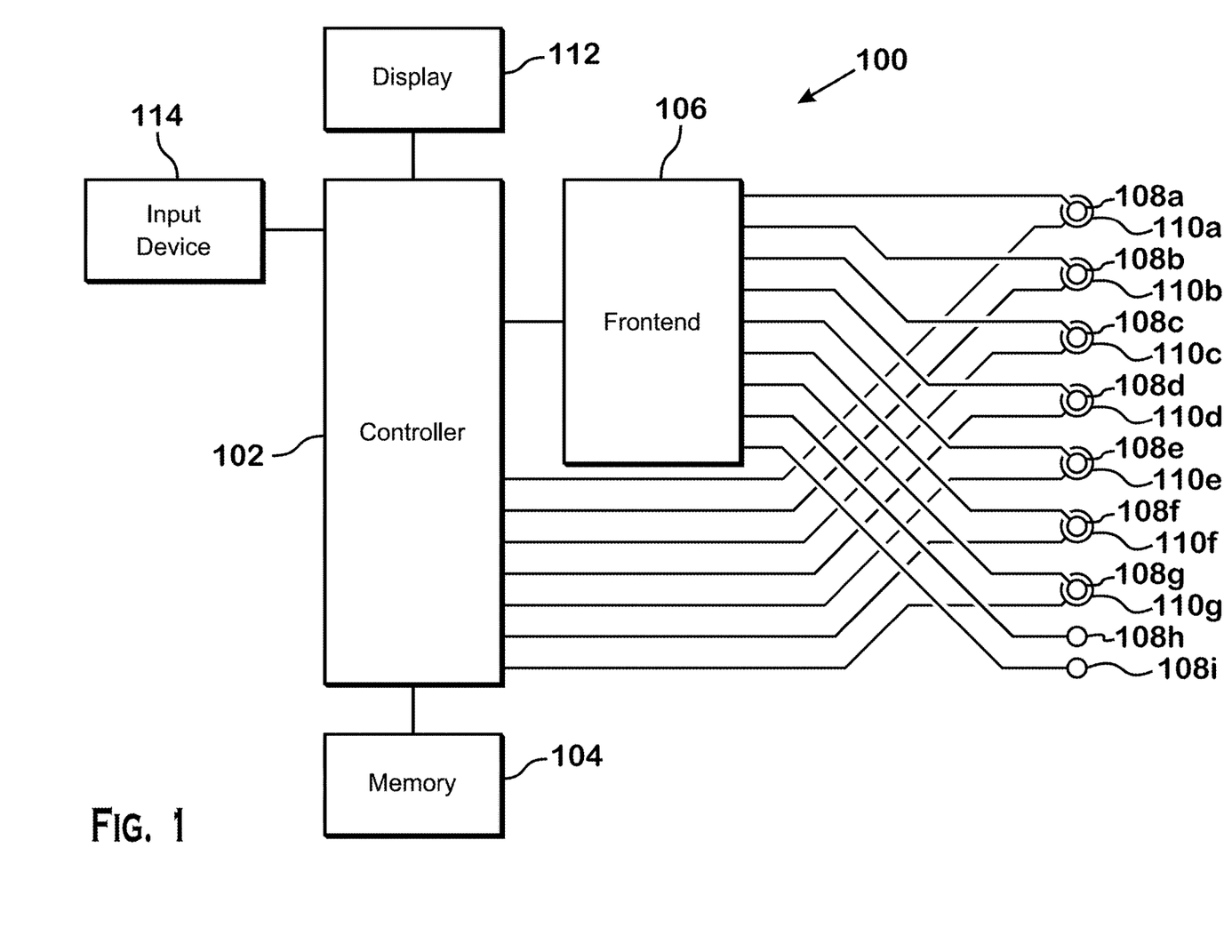
FIG. 1 shows a block diagram of a calibrator in accordance with an embodiment of the present disclosure.

FIG. 1 shows a block diagram of a calibrator 100 in accordance with an embodiment of the present disclosure. The calibrator 100 includes a controller 102, a memory 104, a front-end 106, a plurality of terminals 108a-i, a plurality of light indicators 110a-g, a display 112, and an input device 114. The controller 102 is operatively coupled to the memory 104, the front-end 106, the plurality of light indicators 110a-g, the display 112 and the input device 114. The front-end 106 is coupled to the plurality of terminals 108a-i.

The calibrator 100 may be any electrical testing device, such as an electrical precision source instrument. The calibrator 100 may output alternating current (AC) and direct current (DC) current, voltage, or power signals. The signals have specified electrical quantities (e.g., voltage, current, or frequency). The calibrator 100 outputs the signals over one or more terminals of the plurality of terminals 108a-i. The calibrator 100 may also provide resistance, inductance and capacitance values between two terminals of the plurality of terminals 108a-i. The calibrator 100 may further simulate resistance temperature detectors (RTDs) and thermocouples between its terminals. The calibrator 100 may be used in a laboratory or development setting to present and source precise electrical quantities and/or provide output electrical signals having the electrical quantities.

The controller 102 may be any type of device that is configured to execute instructions (computer-executable instructions) that cause the calibrator 100 to operate as described herein. For example, the controller 102 may be a processor or a microcontroller and may include a central processing unit (CPU) including an arithmetic and logic unit (ALU), a graphics processing unit (GPU), or any other type of processing unit.

The controller 102 receives user input for configuring operation of the calibrator 100 using the input device 114 and/or the display 112, which may be a touchscreen display, as described herein. The controller 102 commands the display 112 to display information to the user and commands the front-end 106 to generate an electrical quantity for outputting over one or more of the plurality of terminals 108a-i. The controller 102 also commands the plurality of light indicators 110a-g to emit light having a specific color.

The memory 104 may be any type of non-transitory computer-readable storage medium. The memory 104 may be read-only memory (ROM) or random access memory (RAM), among others. Further, the memory 104 may be static or dynamic. The memory 104 stores the computer-executable instructions that may be retrieved or accessed by the controller 102 for execution. The computer-executable instructions, when executed by the controller 102, cause the controller 102 (and consequently the calibrator 100) to operate as described herein.

The front-end 106 includes a circuitry configured to generate an electrical quantity and output the electrical quantity over one or more terminals of the plurality of terminals 108a-i. The circuitry may include amplifiers, filters, application-specific integrated circuits (ASICs), and analog components (such as resistors, capacitors, inductors, and transistors), among others. The front-end 106 may include a plurality of channels, whereby each channel may be configured to generate or present an electrical quantity within a range. For example, a first channel may be configured to generate a DC signal having a voltage within a first range, and a second channel may be configured to generate a DC signal having a voltage within a second range. The front-end 106 may selectively couple the first channel or the second channel to a terminal depending on a range of the output signal.

The display 112 may be any type of visual output device configured to output data to a user. The display 112 may be a screen that is configured to display an indication of an electrical quantity output by the calibrator 100 and information, including indicators, associated with the electrical quantity. The display 112 may be a color display. In addition, the display be a touchscreen display operative to receive user input for configuring operation of the calibrator 100.

A light indicator of the plurality of light indicators 110*a-g* may be any light source or a device configured to emit light. For example, the light indicator may be a light-emitting diode (LED) or organic light-emitting diode (OLED), among others. The light indicator may be configured to emit multiple colors. The controller 102 may command the light indicator to emit a specific color and switch between colors. Each light indicator is associated with a respective terminal of the plurality of terminals 108*a-i*. A light indicator may be position proximate to the respective terminal. For example, the light indicator may be circular in shape and may surround the terminal as described herein, or the light indicator may be adjacent to the terminal.

The input device 114 may be any type of device configured to receive user input. The input device 114 may be a keypad, buttons, or a scroll wheel, among others. A user may use the input device 114 to configure the calibrator 100 and functionality thereof. The calibrator 100 may include one or more wired or wireless communication interfaces configured to communicate with an external device. For example, the one or more wired or wireless communication interfaces may be a modem or transceiver. The one or more wired or wireless communication interfaces may communicate with the external device and may send data to the external device.

Figure 2:
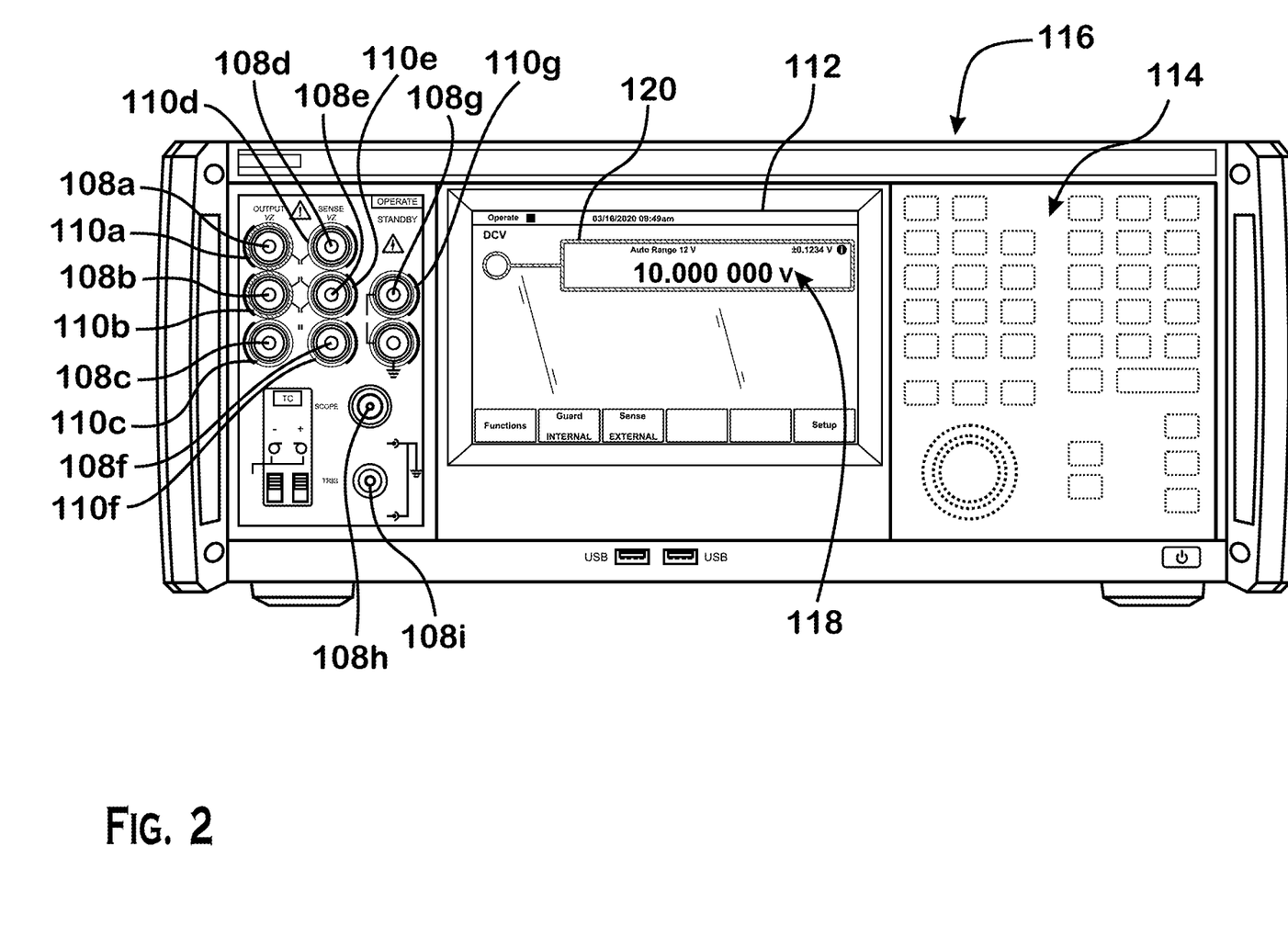
FIG. 2 shows an example of a front panel of the calibrator.

FIG. 2 shows an example of a front panel 116 of the calibrator 100. The front panel 116 includes the plurality of terminals 108*a-i*, plurality of light indicators 110*a-g*, a display 112 and the input device 114. A first set of terminals 108*a-g* of the plurality of terminals 108*a-i* are respectively associated with the plurality of light indicators 110*a-g*, whereas a second set of terminals 108*h-i* of the plurality of terminals 108*a-i* are not associated with a light indicator. Although FIG. 2 shows a light indicator surrounding a respective terminal, the light indicator may otherwise be in proximity of the terminal. For example, the light indicator may be positioned adjacent to the terminal or the front panel 116 may include a trace diagrammatically coupling the light indicator to the terminal.

The display 112 presents an indication 118 of an electrical quantity output by a terminal of the plurality of terminals 108*a-i*. The indication 118 of the electrical quantity is displayed as text including a numeric value of the electrical quantity together with a unit associated with the numeric value. As shown in FIG. 2, the indication 118 of the electrical quantity conveys to the user that the terminal outputs a signal having a voltage of 10 volts (V). The calibrator 100 (or controller 102) may synchronize a color associated with the indication of the electrical quantity with a color emitted by the light indicator associated with the terminal that is outputting the signal. The display 112 thus graphically presents, together with the indication 118 of the electrical quantity, an indication 120 (shown as an outline in FIG. 2) having a color corresponding with or synchronized or matched to a color associated with one or more terminal(s) on which the electrical quantity is output. For example, if the signal is output over first and second terminal 108*a*, 108*b* of the plurality of terminals 108*a-i*, the calibrator 100 displays the outline in blue color. The calibrator 100 also commands the first and second light indicators 110*a*, 110*b* corresponding to the first and second terminals 108*a*, 108*b* to emit blue light. Accordingly, the calibrator 100 uses the indication 120 and the first and second light indicators 110*a*, 110*b* to convey to a user, e.g., personnel or a lab technician, operating the calibrator 100 the terminals over which to tap or draw the displayed electrical quantity.

Alternatively or additionally, the display 112 may display the electrical quantity itself (e.g., 10 V) in a color synchronized to the color emitted by the first and second light indicators 110*a*, 110*b*. Alternatively or additionally, the display 112 may display a colored circle or dot proximate to the electrical quantity and synchronized in color with the first and second light indicators 110*a*, 110*b*.

Figure 3:
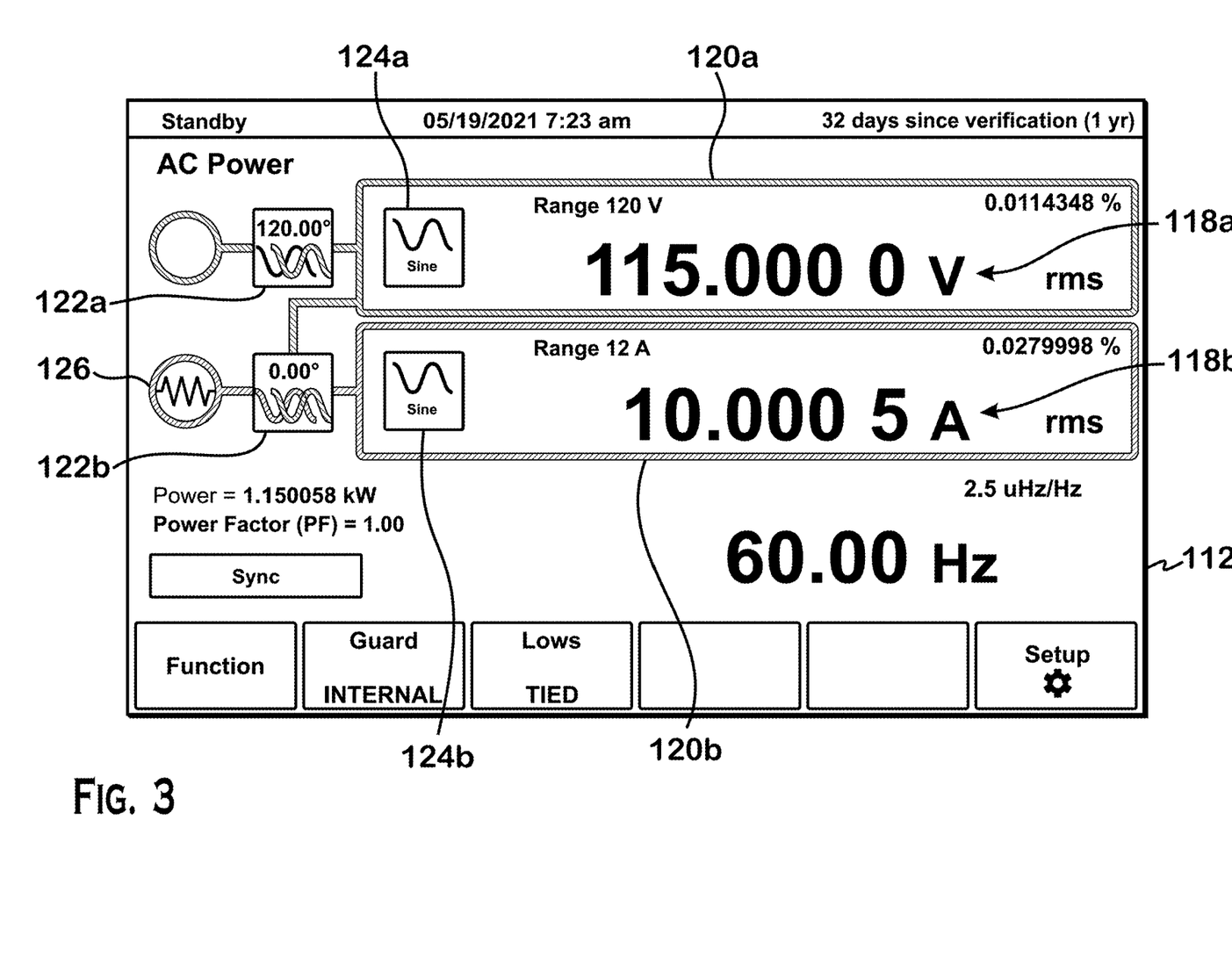
FIG. 3 shows an example of a display of the calibrator.

FIG. 3 shows another example of the display 112 of the calibrator 100. The display 112 shows a first indication 118*a* of a first electrical quantity output by the calibrator 100 and a second indication 118*b* of a second electrical quantity output by the calibrator 100. The first electrical quantity is shown to be an AC voltage having a root mean square (RMS) of 115V, and the second electrical quantity is shown to be AC current having an RMS of 10 ampere (A). The indications 118*a*, 118*b* of the electrical quantities are displayed together with respective indications 120*a*, 120*b* of a particular light color. In this example, each indication 120*a*, 120*b* is shown as an outline of the displayed electrical quantity connected to an outline of a general shape (e.g., circular shape) of a terminal. The circular shape may alternatively be a square shape or another shape. The type of shape may be dependent on the function performed by the calibrator 100. For example, the shape may be square if the calibrator 100 performs a temperature function.

The first indication 120*a* associated with the first electrical quantity has a first color (illustrated in FIG. 2 by left slanted hatching). The calibrator 100 synchronizes the first color with a color emitted by the first light indicator 110*a* associated with the first terminal 108*a*. The calibrator 100 may synchronize the colors by causing the colors to be the same. The calibrator 100 may cause the display 112 to display the first indication 120*a* with the same color as that emitted by the first light indicator 110*a*. For example, the calibrator 100 may cause the first light indicator 110*a* to change the color it emits to match the first color displayed by the display 112. Thus, a user operating the calibrator 100 is informed that the first electrical quantity is drawn at the first terminal 108*a* associated with the first light indicator 110*a*.

Similarly, the second indication 120*b* associated with the second electrical quantity has a second color (illustrated in FIG. 2 by right hatching). The calibrator 100 synchronizes the second color with a color emitted by the second light indicator 110*b* associated with the second terminal 108*b* over which the second electrical quantity is being output. A user operating the calibrator 100 is informed that the second electrical quantity is to be drawn at the second terminal 108*b* associated with the second light indicator 110*b*.

As described herein, a light indicator 110 may be configured to emit a plurality of colors and may, at any point in time, display one of the colors in accordance with an indication displayed on the display 112. For example, when the electrical quantity output by the calibrator 100 is DC or AC voltage or current, the second light indicator 110*b* may emit a first color that is green. Conversely, when the electrical quantity output by the calibrator 100 is DC or AC power, the second light indicator 110*b* may emit a second color that is blue. The calibrator 100 synchronizes the color of the second indication 120*b* accordingly.

In an embodiment, the calibrator 100 may provide the indication 120*a*, 120*b* of the terminal color by displaying the indication 118*a*, 118*b* of the electrical quantity in a certain color. For example, the calibrator 100 may color-code the voltage level and current level of FIG. 3 to indicate the terminal over which the voltage and current are output. The calibrator 100 may color-code the voltage level and current level by displaying text in a certain color. Continuing with the example, the calibrator 100 may display the voltage level in green (e.g., display the text of 115V in green) and the current level in blue (e.g., display the text of 10A in blue) to indicate that the voltage is output by the terminal having a corresponding light indicator that emits green light and the current is output by the terminal having a corresponding light indicator that emits blue light.

The calibrator 100 displays first and second signal property graphical user interface (GUI) elements 122a, 122b associated with the first and second electrical quantities, respectively. The calibrator 100 also displays first and second signal type GUI elements 124a, 124b associated with the first and second electrical quantities, respectively. Response of the calibrator 100 to user selection of the signal property GUI elements 122a, 122b and signal type GUI elements 124a, 124b is described herein. In addition, the calibrator 100 displays an output GUI element 126. The output GUI element 126 graphically indicates to a user an electrical component to be coupled to the respective terminal over which the electrical quantity is output. As shown in FIG. 3, the output GUI element 126 indicates to the user that a resistance is to be coupled to the second terminal 108b.

The signal property GUI elements 122a, 122b are provided to the user to configure or change signal properties of the first and second electrical quantities, respectively. The signal property GUI elements 122a, 122b respectively graphically illustrate a phase angle of the AC voltage and AC current output by the calibrator 100 and permit user adjustment of the phase angles. The first and second signal type GUI elements 124a, 124b are provided to the user to configure or change the signal types of the first and second electrical quantities, respectively. The signal property GUI elements 122a, 122b graphically illustrate a sinusoid and indicate to the user that the AC voltage and AC current output by the calibrator 100 are both sinusoidal signals. The signal type GUI elements 124a, 124b permit the user to change the signal type from among: a sinusoidal wave, a square wave, triangular wave with a specific duty cycle, triangular wave, spike signal, truncated sinusoidal wave or truncated triangular wave, among others.

It is noted that although two electrical quantities are described with reference to FIG. 3, the calibrator 100 may output and display indications of any number of electrical quantities. In addition, the calibrator 100 may perform the color synchronization described herein for any number of electrical quantities.

Figure 4:
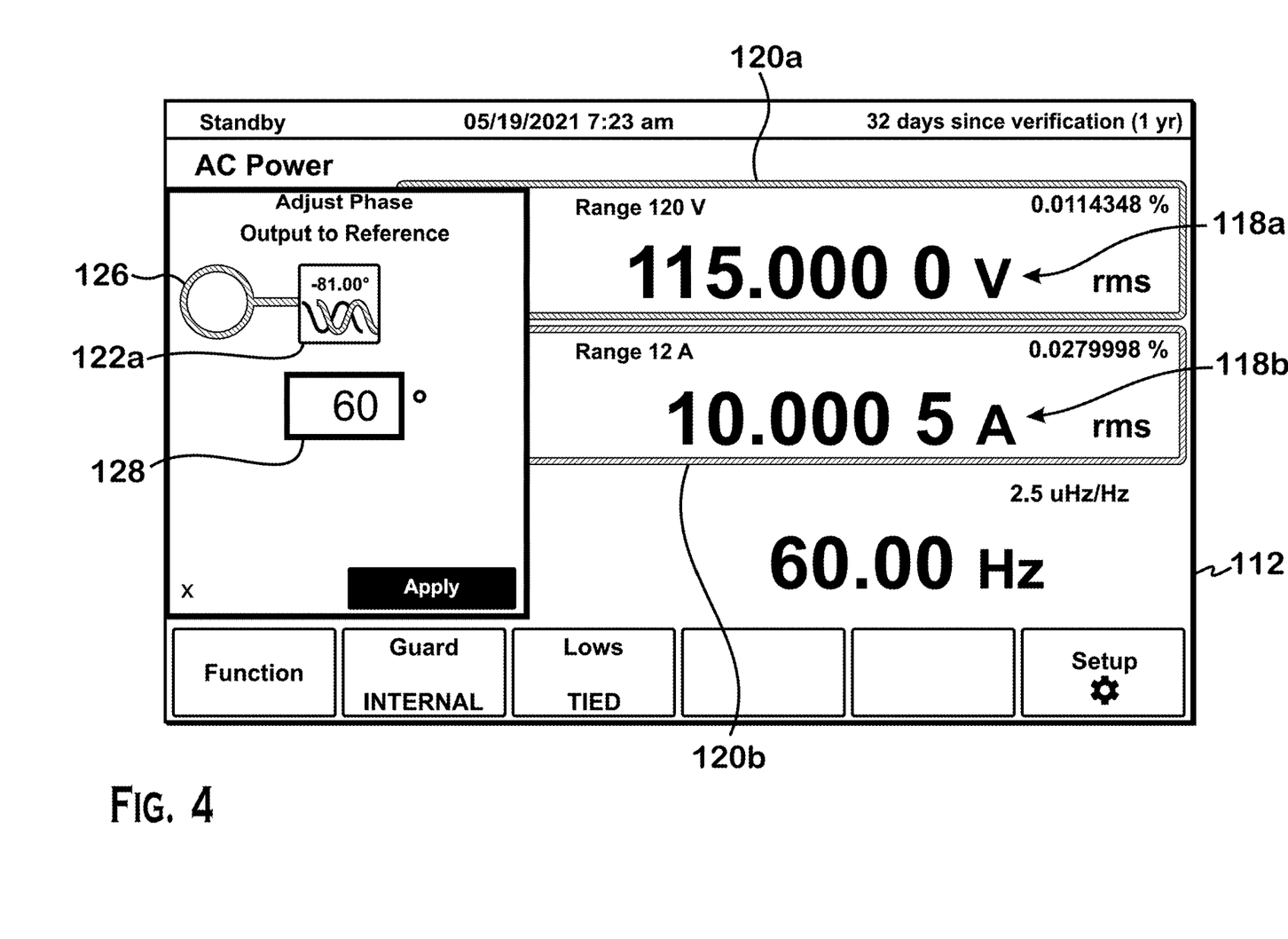
FIG. 4 shows a display of an editable GUI element by the calibrator.

FIG. 4 shows a display of an editable GUI element 128 by the calibrator 100. The calibrator 100 presents the editable GUI element 128 in response to user selection of the first signal property GUI element 122a. The editable GUI element 128 allows a user to adjust a phase angle of the AC voltage. A user may enter the phase angle in the editable GUI element 128 to thereby set the phase angle used by the calibrator 100 in generating the first electrical quantity. The calibrator 100 responds by adjusting the phase of the first electrical quantity. The user may enter the phase angle in the editable GUI element 128 by keying in the phase angle, for example, using an input device 114 of the calibrator 100. The calibrator 100 displays the editable GUI element 128 together with the first signal property GUI element 122a of the first electrical quantity. The display of the first signal property GUI element 122a indicates to the user that input to the editable GUI element 128 adjust the signal property associated with the first signal property GUI element 122a.

In addition, calibrator 100 displays the indication 120a of the terminal light color of the first electrical quantity. The indication 120a signifies to the user the terminal outputting the first electrical quantity that is undergoing a phase angle change.

Figure 5:
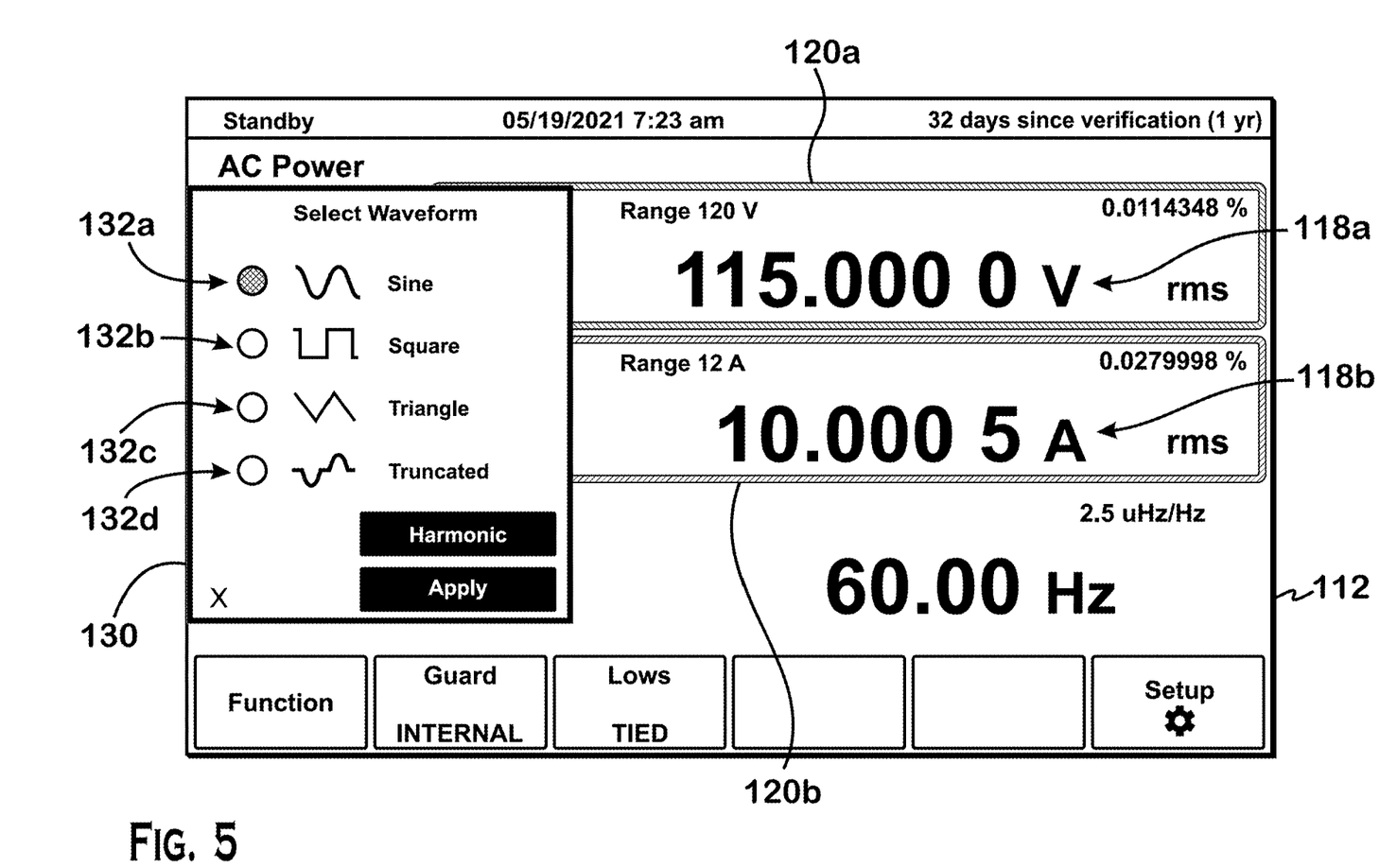
FIG. 5 shows a display of a signal type selection menu by the calibrator.

FIG. 5 shows a display of a signal type selection menu 130 by the calibrator 100. The calibrator 100 may present, on the display 112, the signal type selection menu 130 in response to user selection of the first signal type GUI element 124a. The signal type selection menu 130 includes a plurality of selectable signal type GUI elements 132a-d each representing a respective type of waveform. The plurality of selectable signal type GUI elements 132a-d includes a selectable sinusoidal wave GUI element 132a, a selectable square wave GUI element 132b, a selectable triangular wave GUI element 132a, and a selectable truncated wave GUI element 132a.

The user may select a signal type from the signal type selection menu 130 using the display 112 in the event that the display is a touchscreen display or using the input device 114. In response to receiving the user selection from the signal type selection menu 130, the calibrator 100 changes the signal type (or waveform) of the first electrical quantity per the selection of the user. For example, the calibrator 100 may change the first electrical quantity from an AC voltage having an RMS of 115V and a sinusoidal waveform as shown in FIG. 3 to an AC voltage having an RMS of 115V and a triangular waveform in response to user selection of the selectable triangular wave GUI element 132a from the signal type selection menu 130. As shown in FIG. 5, the calibrator 100 preselects the element 132a corresponding to the sinusoidal wave when the menu 130 is presented. The preselection indicates the current signal type of the first electrical quantity.

Although the signal types described with reference to FIG. 5 pertain to a waveform type, the calibrator 100 may use the same or similar functionality to enable the user to set or modify any other signal property or feature.

Figure 6:
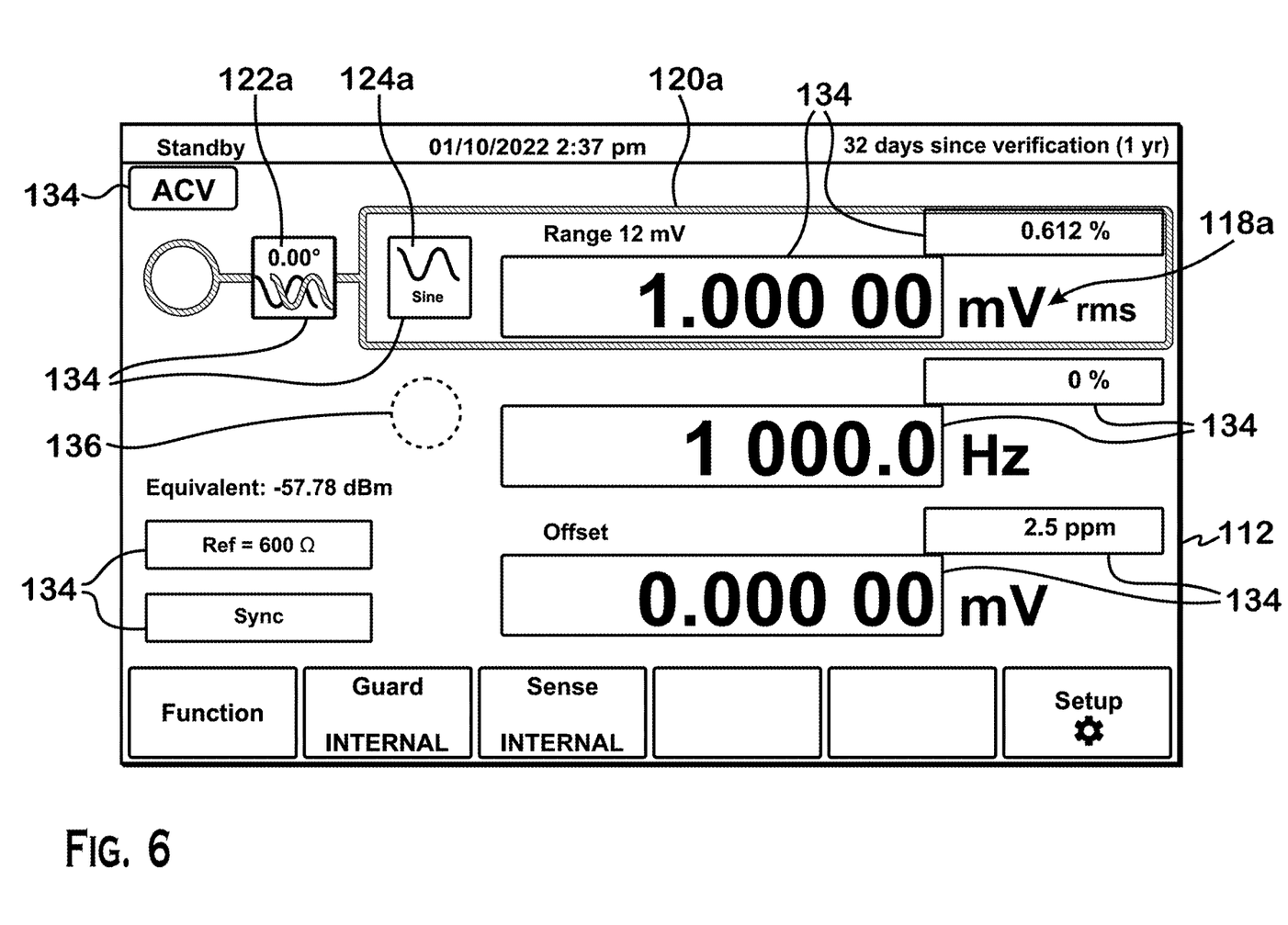
FIG. 6 shows a display of identifications of editable GUI elements by the calibrator.

FIG. 6 shows a display of identifications 134 of editable GUI elements by the calibrator 100. The calibrator 100 display the identifications 134 to point the user to GUI elements that may be edited by the user, for example, directly through a touchscreen feature of the display. The identifications 134 are shown in FIG. 6 as outlines representing boundaries of the editable GUI elements. User selection of a display area within an outline (for example, by applying a touch to the touchscreen display) enables the user to modify a value, quantity, or feature represented by a GUI element. In addition or as an alternative to displaying an outline, the calibrator 100 may display an identification 134 by underlining an element, displaying the element in a specific color or displaying an indicator adjacent to or in a proximity of the element, among others. The indicator displayed adjacent to or in a proximity of the element may have a specific color, such as green.

As shown in FIG. 6, the identifications 134 indicate to the user that a voltage level, frequency, and offset, as well as confidence intervals of the voltage level, frequency, and offset are changeable directly from the display 112. Further, the identifications 134 indicate that a signal phase and waveform shape of the AC voltage, as well as a reference resistance and properties of the reference resistance, are changeable directly from the display 112. The user may directly modify any of the identified fields by selecting a field and entering a corresponding setting. When the user enters the setting, the calibrator 100 adjust the electrical quantity in accordance with the setting. In this manner, the calibrator 100 provides an enhanced user interface (UI) that simplifies user operation of the calibrator 100 by allowing direct modification of functionality of the calibrator without requiring the user to navigate multiple, complicated menu structures, while also visually indicating the proper terminals of the calibrator to use in the current calibrator configuration.

The calibrator 100 displays the identifications 134 of the editable elements in response to user selection of a first area 136 of the display 112 that does not include an editable element. For example, if the user selects an area of the display 112 on which information is not displayed, the calibrator 100 responds by displaying the identifications 134 to point the user to GUI elements (and second areas of the display 112 covering the elements) that are in fact responsive to user input and directly editable from the display 112. The user may, accordingly, modify quantities or features by interacting with the displayed elements.

Figure 7:
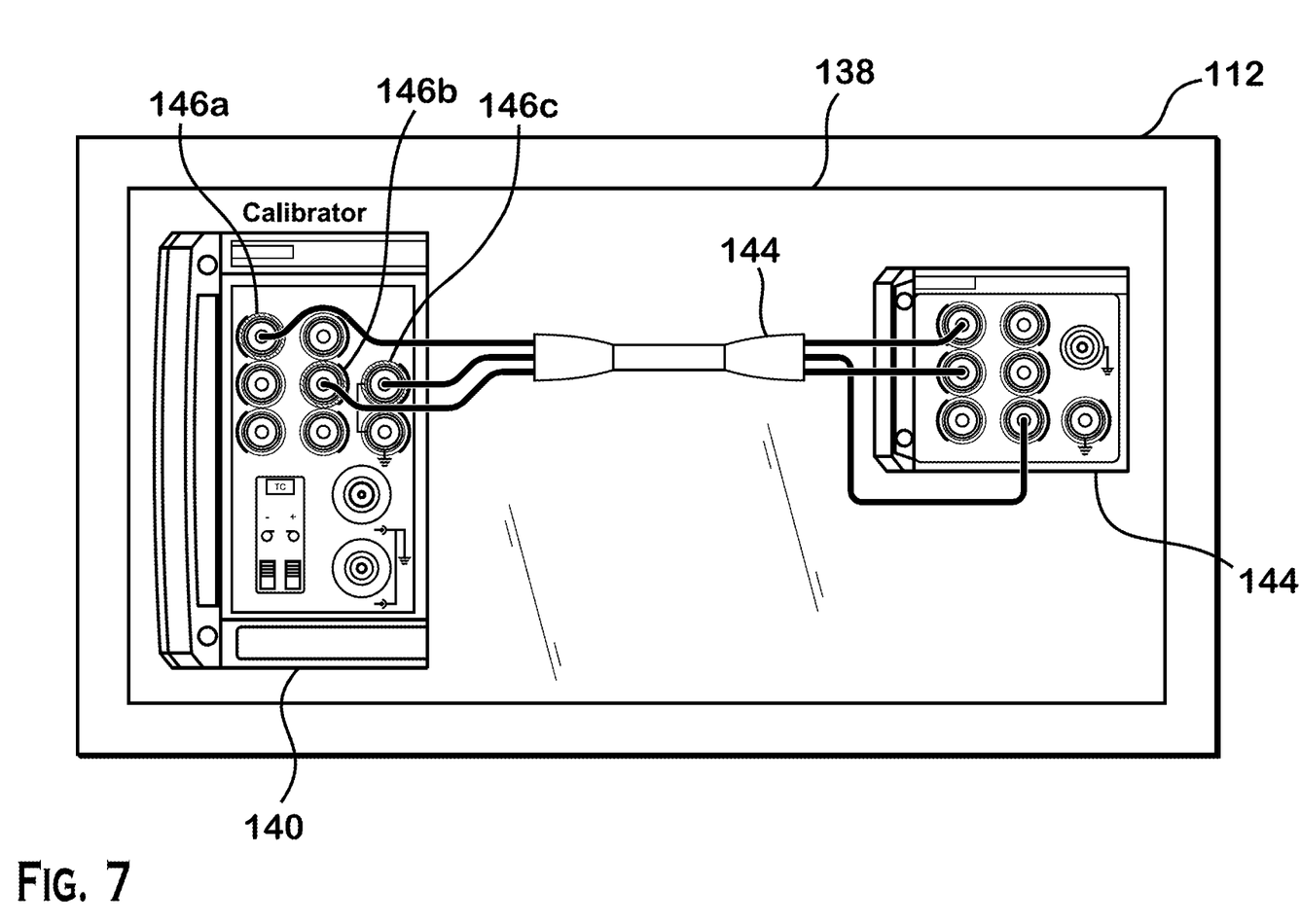
FIG. 7 shows a display of a connectivity diagram by the calibrator.

FIG. 7 shows a display of a connectivity diagram 138 by the calibrator 100. The calibrator 100 may display the connectivity diagram 138 in response to user selection, from the display 112, of a GUI element (not shown) permitting a user to command display of the connectivity diagram 138. The connectivity diagram 138 includes a representation 140 of the calibrator 100, a representation 142 of a device, and representation 144 of a connector coupling the calibrator 100 to the device. The representations 140, 142, 144 diagrammatically show the calibrator 100, device, and connector, respectively. The representations 140, 142, 144 include representations of respective terminals of the calibrator 100 and device, and electrical leads of the connector. The connectivity diagram 138 shows connections to be made between the connector and both the calibrator 100 and the device. The connectivity diagram 138 may aid a user (e.g., a technician or testing personnel) in performing a calibration on the calibrator 100 and inform the user of a connectivity to be used to perform the calibration. Alternatively, the device may be a device under test (DUT) or a device receiving an electrical quantity output by the calibrator 100, and the connectivity diagram 138 may aid the user in connecting the calibrator 100 to the device.

The representation 140 of the calibrator 100 shows the relative positions of the terminals of the calibrator. The representation 140 of the calibrator 100 also includes representations 146a-c of colors of light associated with the terminals of the calibrator 100 with which the connector is coupled. Simultaneously with the presentation of the connectivity diagram 138, the calibrator 100 causes light indicators to emit light having colors shown in the connectivity diagram 138 as described herein. Accordingly, the connectivity diagram 138 informs the user of identities of terminals to couple to the connector using both the relative positions of the terminals and colors of light emitted by light indicators associated with the terminals.

Figure 8:
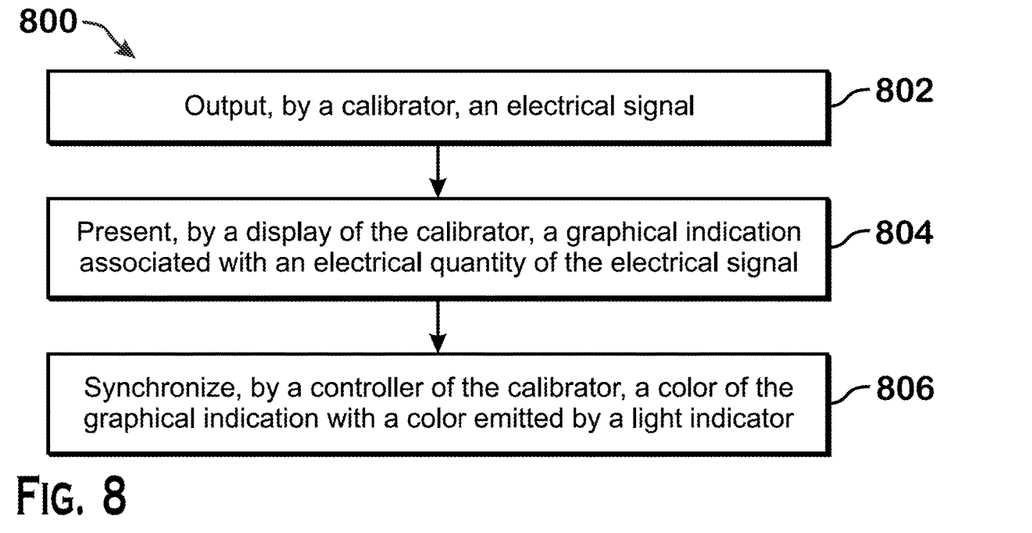
FIG. 8 shows a flow diagram of a method for operating the calibrator.

FIG. 8 shows a flow diagram of a method 800 for operating the calibrator 100. As described herein, the calibrator 100 may be any electrical testing device. The method 800 includes, at 802, outputting, by an output terminal of the calibrator 100, an electrical signal. The electrical signal may be any AC or DC signal. For example, the electrical signal may be a voltage, current, or power signal. The output terminal is associated with a light indicator, whereby the light indicator may be positioned proximate to the output terminal on a front panel of the calibrator 100.

At 804, a display of the calibrator 100 presents a graphical indication associated with an electrical quantity of the electrical signal. The graphical indication may be an outline surrounding the electrical quantity. Additionally or alternately, the graphical indication may be an underlining of the electrical quantity or other graphical indication. Presenting the electrical quantity may including presenting a numeric value of the electrical quantity (e.g., in a textual format) as well as units of the electrical quantity.

At 806, a controller of the calibrator 100 synchronizes a color of the graphical indication with a color emitted by the light indicator. Synchronizing the colors may include causing the display to display the graphical indication having the same color as the light emitted by the light indicator.

Figure 9:
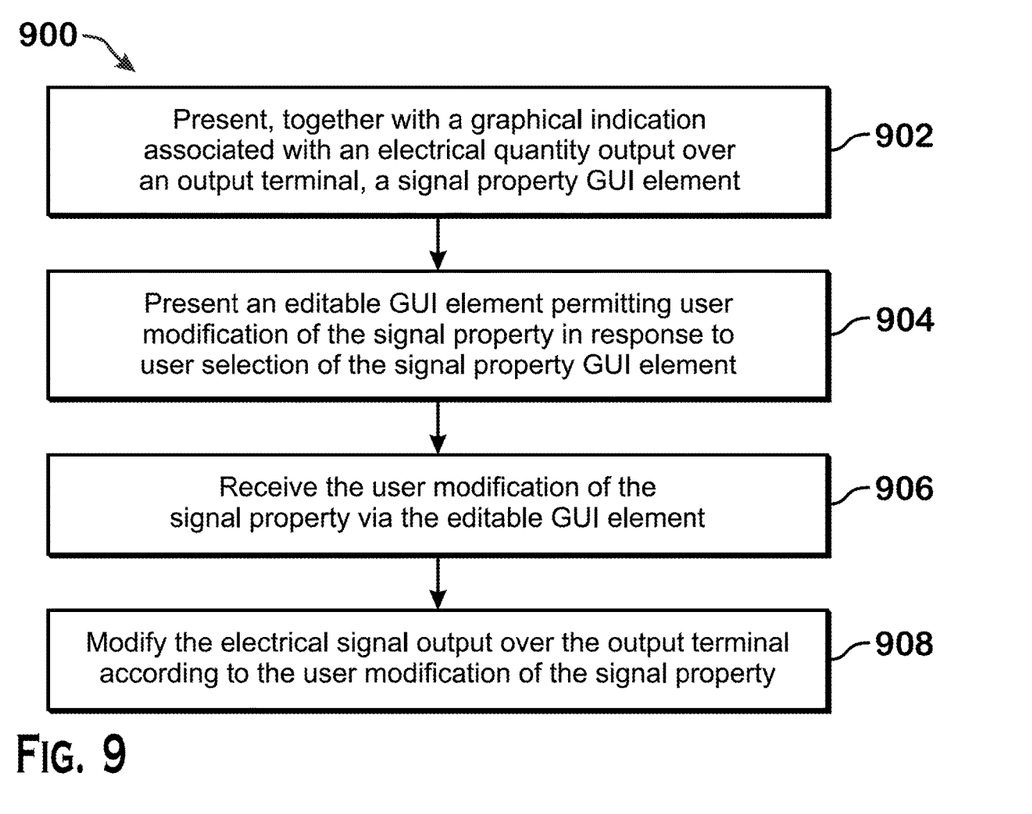
FIG. 9 shows a flow diagram of a method for operating the calibrator.

FIG. 9 shows a flow diagram of a method 900 for operating the calibrator 100. In the method, the calibrator 100, at 902, presents, together with a graphical indication associated with an electrical quantity, a signal property GUI element. The signal property GUI element may be selectable and representative of a signal property associated with the electrical signal. The signal property may be a phase, and the signal property GUI element may graphically illustrate a phase angle and permit user adjustment of a phase angle of AC voltage or AC current output by the calibrator 100.

The user may select the signal property GUI element. The calibrator 100, at 904, presents an editable GUI element permitting user modification of the signal property in response to user selection of the signal property GUI element. At 906, the calibrator 100 receives the user modification of the signal property via the editable GUI element. At 908, the calibrator 100 modifies the electrical signal output over the output terminal according to the user modification of the signal property. The calibrator 100 may set the phase of the electrical signal to the phase entered by the user in the editable GUI element.

Figure 10:
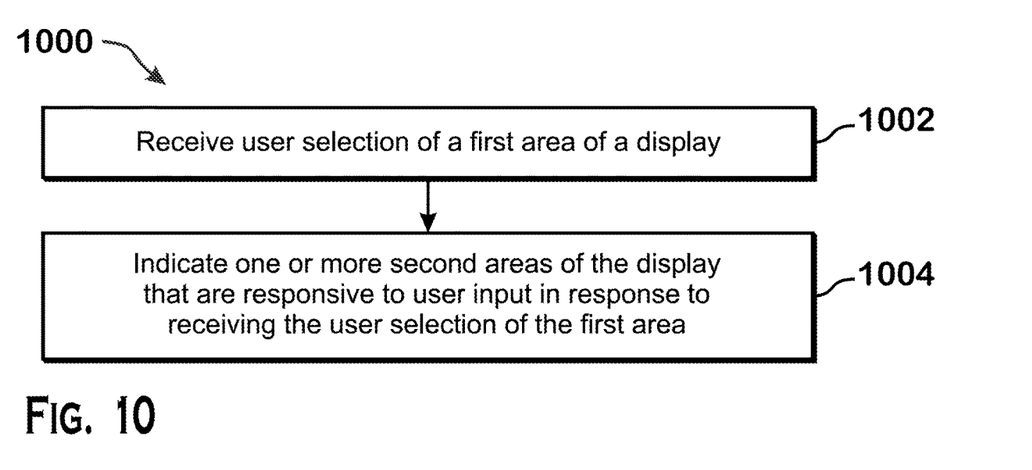
FIG. 10 shows a flow diagram of a method for operating the calibrator.

FIG. 10 shows a flow diagram of a method 1000 for operating the calibrator 100. The calibrator 100, receives user selection of a first area of the display at 1002. The first area of the display may not be used to present information (e.g., electrical quantities or parameters) to the user and selection of the first area may not cause direct presentation of an editable element or field in which the user may set an electrical quantity. For example, the first area may be a blank space on the display.

The calibrator 100, at 1004, in response to receiving the user selection of the first area, indicates one or more second areas of the display that are responsive to user input. As described herein, indicating the one or more second areas may including applying a border to the one or more second areas or displaying the one or more second areas with a different brightness (brighter or dimmer) than other areas of the display, among others.

Figure 11:
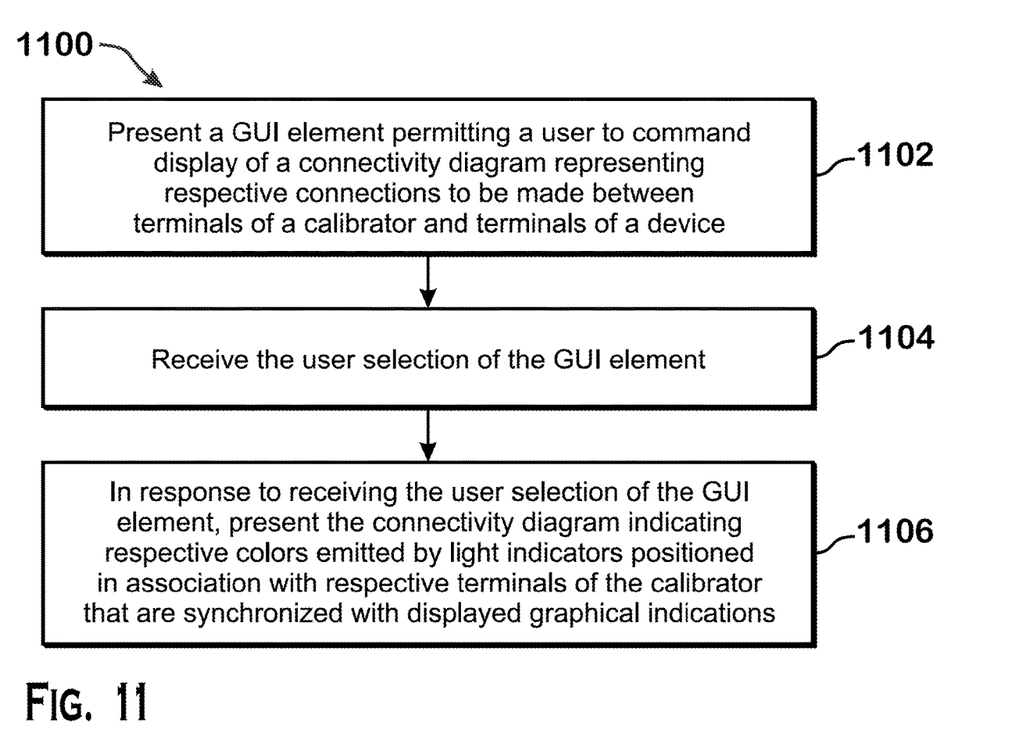
FIG. 11 shows a flow diagram of a method for operating the calibrator.

FIG. 11 shows a flow diagram of a method 1100 for operating the calibrator 100. The calibrator 100, at 1102, presents a GUI element permitting a user to command display of a connectivity diagram representing respective connections to be made between terminals of the calibrator and terminals of a device, which may be a voltmeter, among others. The connectivity diagram may provide information to a user as to the manner in which the calibrator 100 is to be coupled to the device.

At 1104, the calibrator 100 receives user selection of the GUI element. The calibrator 100, at 1106, in response to receiving the user selection of the GUI element, presents the connectivity diagram indicating respective colors emitted by light indicators positioned in association with respective terminals of the calibrator that are synchronized with displayed graphical indications. As described herein, the connectivity diagram shows the colors emitted by the light indicators at the time when the connectivity diagram is displayed. The user can identify terminals indicated on the connectivity diagram based on a correspondence between colors of the connectivity diagram and the colors emitted by the light indicators.

In view of the foregoing disclosure, various examples of an electrical testing device and calibrator may include any one or combination of the following features: an output terminal configured to output an electrical signal; a light indicator positioned in association with the output terminal and configured to emit light; a display configured to present a graphical indication associated with an electrical quantity of the electrical signal; and a controller configured to synchronize a color of the graphical indication with a color emitted by the light indicator.

The calibrator and testing device may include another feature, such as the controller being configured to synchronize the color of the graphical indication with the color emitted by the light indicator by causing the light indicator to emit the same color as the color used by the display to present the graphical indication.

The calibrator and testing device may include another feature, such as the light indicator being configured to: emit one of a plurality of colors including the color synchronized with the color of the graphical indication and a second color; and dynamically change to emit the second color in response to the electrical signal changing from one type of electrical signal to a different type of electrical signal.

The calibrator and testing device may include another feature, such as the controller being configured to cause the display to: present, together with the graphical indication associated with the electrical quantity, a signal property GUI element that is selectable and representative of a signal property associated with the electrical signal; and in response to user selection of the signal property GUI element, present an editable GUI element permitting user modification of the signal property.

The calibrator and testing device may include another feature, such as the controller being configured to: receive the user modification, via the editable GUI element, of the signal property; and modify the electrical signal output over the output terminal according to the user modification of the signal property.

The calibrator and testing device may include another feature, such as the signal property GUI element graphically representing a phase angle, and the controller being configured to, in response to the user selection of the signal property GUI element, display the editable GUI element permitting user modification of the phase angle of the electrical signal.

The calibrator and testing device may include another feature, such as the display including a first area, and the controller being configured to: in response to receiving user selection of the first area, cause the display to indicate one or more second areas of the display that are responsive to user input.

The calibrator and testing device may include another feature, such as the one or more second areas including one or more GUI elements, and the controller being configured to cause the display to indicate the one or more GUI elements by outlining the one or more GUI elements with respective boundaries of the one or more GUI elements.

The calibrator and testing device may include another feature, such as a plurality of terminals including the output terminal; and a plurality of light indicators including the light indicator, the plurality of light indicators being positioned in association with the plurality of terminals, respectively, The calibrator and testing device may include another feature, such as the controller being configured to: cause the display to present a GUI element permitting a user to command display of a connectivity diagram representing respective connections to be made between the plurality of terminals of the calibrator and terminals of a device and indicating respective colors emitted by the plurality of light indicators of the calibrator that are synchronized with displayed graphical indications; receive user selection of the GUI element; and in response to the user selection of the GUI element, cause the connectivity diagram to be presented on the display.

In view of the foregoing disclosure, various examples of method performed by an electrical testing device may include any one or combination of the following features: outputting, by an output terminal of an electrical testing device, an electrical signal, where the electrical testing device has a light indicator positioned in association with the output terminal; presenting, by a display of the electrical testing device, a graphical indication associated with an electrical quantity of the electrical signal; and synchronizing a color of the graphical indication of the display of the electrical testing device with a color emitted by the light indicator associated with the output terminal.

The method and testing device may include another feature, such as emitting, by the light indicator, one of a plurality of colors including the color synchronized with the color of the graphical indication and a second color; and dynamically changing the light indicator to emitting the second color in response to the electrical signal changing from one type of electrical signal to a different type of electrical signal.

The method and testing device may include another feature, such as presenting, together with the graphical indication associated with the electrical quantity, a signal property GUI element that is selectable and representative of a signal property associated with the electrical signal; and in response to user selection of the signal property GUI element, presenting an editable GUI element permitting user modification of the signal property.

The method and testing device may include another feature, such as receiving the user modification, via the editable GUI element, of the signal property; and modifying the electrical signal output over the output terminal according to the user modification of the signal property.

The method and testing device may include another feature, such as the signal property GUI element graphically representing a phase angle.

The method and testing device may include another feature, such as in response to the user selection of the signal property GUI element, displaying the editable GUI element permitting user modification of the phase angle of the electrical signal.

The method and testing device may include another feature, such as receiving user selection of a first area of the display; and in response to receiving the user selection of the first area, indicating one or more second areas of the display that are responsive to user input.

The method and testing device may include another feature, such as the one or more second areas including one or more GUI elements.

The method and testing device may include another feature, such as indicating the one or more GUI elements on the display by outlining the one or more GUI elements with respective boundaries of the one or more GUI elements.

The method and testing device may include another feature, such as presenting, by the display, a GUI element permitting a user to command display of a connectivity diagram representing respective connections to be made between terminals of the electrical testing device and terminals of a device and indicating respective colors emitted by light indicators positioned in association with respective terminals of the electrical testing device that are synchronized with displayed graphical indications; receiving user selection of the GUI element; and in response to receiving the user selection of the GUI element, presenting the connectivity diagram on the display.

In view of the foregoing disclosure, various examples of a calibrator may include any one or combination of the following features: a controller; and memory having stored thereon executable instructions that, when executed by the controller, cause the controller to: command a display to present a graphical indication associated with an electrical quantity of an electrical signal, the electrical signal being output by a terminal of the calibrator; and synchronize a color of the graphical indication with a color emitted a light indicator positioned in association with the terminal.

The calibrator may include another feature, such as the executable instructions causing the controller to: command the display to present, together with the graphical indication of the electrical quantity, a signal property GUI element that is selectable and representative of a signal property associated with the electrical signal; in response to user selection of the signal property GUI element, command the display to present an editable GUI element permitting user modification of the signal property; receive the user modification, via the editable GUI element, of the signal property; and modify the electrical signal output over the terminal according to the user modification of the signal property.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A calibrator, comprising:
an output terminal configured to output an electrical signal;
a light indicator positioned in association with the output terminal and configured to emit light;
a display configured to present a graphical indication associated with an electrical quantity of the electrical signal; and
a controller configured to:
synchronize a color of the graphical indication with a color emitted by the light indicator;
cause the display to present, together with the graphical indication associated with the electrical quantity, a first graphical user interface (GUI) element that is selectable by a user and indicative of a first signal type of the electrical signal;
in response to user selection of the first GUI element, cause the display to display a plurality of GUI elements;
receive user selection of a second GUI element of the plurality of GUI elements, the second GUI element being indicative of a second signal type different than the first signal type; and
in response to receiving the user selection of the second GUI element,
change a signal type of the electrical signal from the first signal type to the second signal type; and
cause the output terminal to output the electrical signal having the second signal type.

2. The calibrator as claimed in claim 1, wherein the controller is configured to synchronize the color of the graphical indication with the color emitted by the light indicator by causing the light indicator to emit the same color as the color used by the display to present the graphical indication.

3. The calibrator as claimed in claim 1, wherein the light indicator is configured to:
emit one of a plurality of colors including the color synchronized with the color of the graphical indication and a second color; and
dynamically change to emit the second color in response to the electrical signal changing from one type of electrical signal to a different type of electrical signal.

4. The calibrator as claimed in claim 1, wherein the controller is configured to cause the display to:
present, together with the graphical indication associated with the electrical quantity, a signal property GUI element that is selectable and representative of a signal property associated with the electrical signal; and
in response to user selection of the signal property GUI element, present an editable GUI element permitting user modification of the signal property.

5. The calibrator as claimed in claim 4, wherein the controller is configured to:
receive the user modification, via the editable GUI element, of the signal property; and
modify the electrical signal output over the output terminal according to the user modification of the signal property.

6. The calibrator as claimed in claim 4, wherein:
the signal property GUI element graphically represents a phase angle, and
the controller is configured to, in response to the user selection of the signal property GUI element, display the editable GUI element permitting user modification of the phase angle of the electrical signal.

7. The calibrator as claimed in claim 1, wherein:
the display includes a first area, and
the controller is configured to:
in response to receiving user selection of the first area, cause the display to indicate one or more second areas of the display that are responsive to user input.

8. The calibrator as claimed in claim 7, wherein:
the one or more second areas include one or more GUI elements, and
the controller is configured to cause the display to indicate the one or more GUI elements by outlining the one or more GUI elements with respective boundaries of the one or more GUI elements.

9. The calibrator as claimed in claim 1, comprising:
a plurality of terminals including the output terminal; and
a plurality of light indicators including the light indicator, the plurality of light indicators being positioned in association with the plurality of terminals, respectively,
wherein the controller is configured to:
cause the display to present a GUI element permitting a user to command display of a connectivity diagram representing respective connections to be made between the plurality of terminals of the calibrator and terminals of a device and indicating respective colors emitted by the plurality of light indicators of the calibrator that are synchronized with displayed graphical indications;
receive user selection of the GUI element; and
in response to the user selection of the GUI element, cause the connectivity diagram to be presented on the display.

10. A method, comprising:
outputting, by an output terminal of an electrical testing device, an electrical signal, wherein the electrical testing device has a light indicator positioned in association with the output terminal;
presenting, by a display of the electrical testing device, a graphical indication associated with an electrical quantity of the electrical signal;
synchronizing a color of the graphical indication of the display of the electrical testing device with a color emitted by the light indicator associated with the output terminal;
causing the display to present, together with the graphical indication associated with the electrical quantity, a first graphical user interface (GUI) element that is selectable by a user and indicative of a first signal type of the electrical signal;
in response to user selection of the first GUI element, causing the display to display a plurality of GUI elements;
receiving user selection of a second GUI element of the plurality of GUI elements, the second GUI element being indicative of a second signal type different than the first signal type; and
in response to receiving the user selection of the second GUI element,
changing a signal type of the electrical signal from the first signal type to the second signal type; and
causing the output terminal to output the electrical signal having the second signal type.

11. The method as claimed in claim 10, comprising:
emitting, by the light indicator, one of a plurality of colors including the color synchronized with the color of the graphical indication and a second color; and
dynamically changing the light indicator to emitting the second color in response to the electrical signal changing from one type of electrical signal to a different type of electrical signal.

12. The method as claimed in claim 10, comprising:
presenting, together with the graphical indication associated with the electrical quantity, a signal property GUI element that is selectable and representative of a signal property associated with the electrical signal; and
in response to user selection of the signal property GUI element, presenting an editable GUI element permitting user modification of the signal property.

13. The method as claimed in claim 12, comprising:
receiving the user modification, via the editable GUI element, of the signal property; and
modifying the electrical signal output over the output terminal according to the user modification of the signal property.

14. The method as claimed in claim 13, wherein:
the signal property GUI element graphically represents a phase angle, and
the method includes:
in response to the user selection of the signal property GUI element, displaying the editable GUI element permitting user modification of the phase angle of the electrical signal.

15. The method as claimed in claim 10, comprising:
receiving user selection of a first area of the display; and
in response to receiving the user selection of the first area, indicating one or more second areas of the display that are responsive to user input.

16. The method as claimed in claim 15, wherein:
the one or more second areas include one or more GUI elements, and
the method includes indicating the one or more GUI elements on the display by outlining the one or more GUI elements with respective boundaries of the one or more GUI elements.

17. The method as claimed in claim 10, comprising:
presenting, by the display, a GUI element permitting a user to command display of a connectivity diagram representing respective connections to be made between terminals of the electrical testing device and terminals of a device and indicating respective colors emitted by light indicators positioned in association with respective terminals of the electrical testing device that are synchronized with displayed graphical indications;
receiving user selection of the GUI element; and
in response to receiving the user selection of the GUI element, presenting the connectivity diagram on the display.

18. A calibrator, comprising:
a controller; and
memory having stored thereon executable instructions that, when executed by the controller, cause the controller to:
command a display to present a graphical indication associated with an electrical quantity of an electrical signal, the electrical signal being output by a terminal of the calibrator;
synchronize a color of the graphical indication with a color emitted a light indicator positioned in association with the terminal;
cause the display to present, together with the graphical indication associated with the electrical quantity, a first graphical user interface (GUI) element that is selectable by a user and indicative of a first signal type of the electrical signal;
in response to user selection of the first GUI element, cause the display to display a plurality of GUI elements;
receive user selection of a second GUI element of the plurality of GUI elements, the second GUI element being indicative of a second signal type different than the first signal type; and
in response to receiving the user selection of the second GUI element,
change a signal type of the electrical signal from the first signal type to the second signal type; and
cause the terminal to output the electrical signal having the second signal type.

19. The calibrator as claimed in claim 18, wherein the executable instructions cause the controller to:
command the display to present, together with the graphical indication of the electrical quantity, a signal property GUI element that is selectable and representative of a signal property associated with the electrical signal;
in response to user selection of the signal property GUI element, command the display to present an editable GUI element permitting user modification of the signal property;

receive the user modification, via the editable GUI element, of the signal property; and modify the electrical signal output over the terminal according to the user modification of the signal property.

20. A calibrator, comprising:

a plurality of terminals including an output terminal configured to output an electrical signal;

a plurality of light indicators positioned in association with the plurality of terminals, respectively, and configured to emit light;

a display configured to display a graphical indication associated with an electrical quantity of the electrical signal; and a controller configured to:
synchronize a color of the graphical indication with a color emitted by a light indicator of the plurality of light indicators that is positioned in association with the output terminal;

cause the display to present a GUI element permitting a user to command display of a connectivity diagram representing respective connections to be made between the plurality of terminals and terminals of a device and indicating respective colors emitted by the plurality of light indicators that are synchronized with displayed graphical indications;

receive user selection of the GUI element; and in response to the user selection of the GUI element, cause the connectivity diagram to be presented on the display.

* * * * *